United States Patent
Lee et al.

(10) Patent No.: US 7,586,152 B2
(45) Date of Patent: Sep. 8, 2009

(54) SEMICONDUCTOR STRUCTURE

(75) Inventors: Tzung-Han Lee, Taipei (TW);
Chih-Hao Cheng, Taipei County (TW);
Chung-Yuan Lee, Tao-Yuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 11/949,047

(22) Filed: Dec. 3, 2007

(65) Prior Publication Data

US 2009/0001513 A1    Jan. 1, 2009

(30) Foreign Application Priority Data

Jun. 26, 2007    (TW) ................ 96123070 A

(51) Int. Cl.
*H01L 29/76*    (2006.01)
*H01L 29/94*    (2006.01)
*H01L 31/062*   (2006.01)
*H01L 31/113*   (2006.01)
*H01L 31/119*   (2006.01)

(52) U.S. Cl. ...................... 257/330; 257/334
(58) Field of Classification Search ........... 257/206, 257/288, 296, 330, E27.108, E29.16, E21.177, 257/E21.428, 334
See application file for complete search history.

(56) References Cited

U.S. PATENT DOCUMENTS

| 6,312,993 | B1 | 11/2001 | Hshieh |
| 7,358,595 | B2 * | 4/2008 | Shin ................ 257/640 |
| 2005/0272233 | A1 | 12/2005 | Lee |
| 2007/0007606 | A1 * | 1/2007 | Shin ................ 257/412 |
| 2007/0148899 | A1 * | 6/2007 | Kim ................ 438/396 |

FOREIGN PATENT DOCUMENTS

| CN | 1423840 A | 6/2003 |
| JP | P200323104 A | 1/2003 |

\* cited by examiner

*Primary Examiner*—Thien F Tran
(74) *Attorney, Agent, or Firm*—Winston Hsu

(57) ABSTRACT

The present invention discloses a structure of a buried word line, which comprises a semiconductor substrate having a U-shape trench, a U-shape gate dielectric layer in the U-shape trench, a polysilicon layer on the U-shape gate dielectric layer, a conducting layer on the polysilicon layer, and a cover dielectric layer on the conducting layer. The semiconductor structure may have a minimized size and when recess channels are formed thereby, the integration is accordingly improved without suffering from the short channel effect.

7 Claims, 3 Drawing Sheets

SEMICONDUCTOR STRUCTURE

BACKGROUND OF THE INVENTION

1. Field of the Invention

The present invention relates to a structure of a semiconductor device, and particularly to a structure of a buried word line.

2. Description of the Prior Art

As electronic products are becoming lighter, thinner, shorter, and smaller, dynamic random access memory (DRAM) geometries are being scaled down to match the trends of high integration and high density. DRAM composed of a lot of memory cells is one of the most popular volatile memory devices. Each memory cell of DRAM comprises a MOS (metal-oxide-semiconductor) transistor and at least a capacitor stacked each other in a series connection. By using word lines and bit lines, DRAM can be read and programmed.

In order to miniaturize DRAM, gate channel length is shortened, but the short channel effect becomes an obstacle to the improvement of the integration of the semiconductor device. Methods of avoiding the short channel effect had been proposed, for example, decreasing the thickness of the gate oxide layer, increasing dopant concentration, and the like. However, theses methods may encounter some problems, such as low element reliability and slow data transfer rates, and are unsuitable to be actually used.

In order to solve these problems, a hole type recess channel MOS transistor has been developed and gradually adopted to increase the integration. In comparison with a conventional horizontal MOS transistor, the hole type recess channel MOS transistor includes the gate and the source/drain formed in an etched trench of a semiconductor substrate, and furthermore, the gate channel region is disposed at the bottom portion of the trench, thereby to reduce the horizontal area of the MOS transistor for improving the device integration.

FIG. 1 illustrates a schematically cross-sectional view of a recess channel MOS transistor device having a gate structure and a word line structure thereabove, which is constructed in a semiconductor substrate 10. The MOS transistor includes a gate oxide layer 12, a polysilicon layer 14, a doped polysilicon layer 16, an inner spacer 18, a polysilicon layer 20, a tungsten metal layer 22, a silicon nitride layer 24, and spacers 26. The tungsten metal layer 22 serving as a word line is disposed above the surface of the semiconductor substrate 10.

To improve the integration of a semiconductor device is constantly a subject to be researched and developed, and, therefore, there is still a need for a novel MOS transistor device structure.

SUMMARY OF THE INVENTION

One object of the present invention is to provide a structure of a buried word line, which has a film stack structure. Each film may be very thin, and accordingly the integration of the semiconductor device can be improved.

The semiconductor structure according to the present invention comprises a substrate having a trench defined in the substrate; a dielectric layer formed on a bottom surface of the trench; a gate region formed on and enclosed by the dielectric layer in the trench; a conducting layer formed above the gate region in the trench, the conducting layer being electrically connected to the gate region; a pair of inner spacers formed on two opposed inner surfaces of the trench to surround the conducting layer, wherein each of the pair of the inner spacers has a bottom edge connecting to a respective one of two ends of the dielectric layer; and a cover dielectric layer formed on top of the trench to cover the conducting layer.

The semiconductor structure according to the present invention is a film stack structure, in which, a buried word line and a recess channel is formed in the semiconductor substrate. Since each film of the film stack structure can be very thin, the integration of the semiconductor device can be improved. Furthermore, due to the design of recess channel, the short channel effect can be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
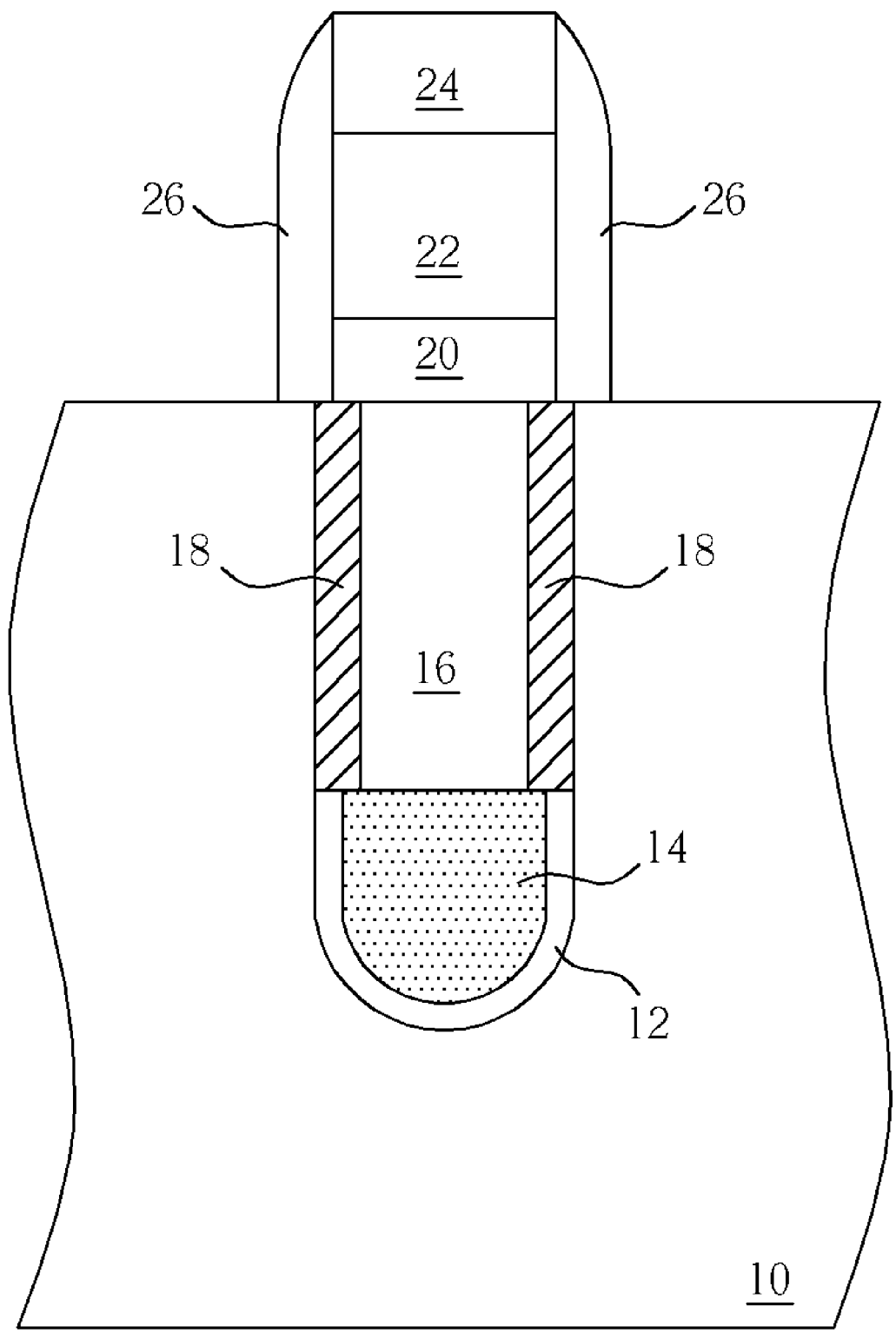
FIG. 1 illustrates a schematically cross-sectional view of a conventional recess channel MOS transistor device having a gate structure and a word line structure above the gate structure.
Figure 2:
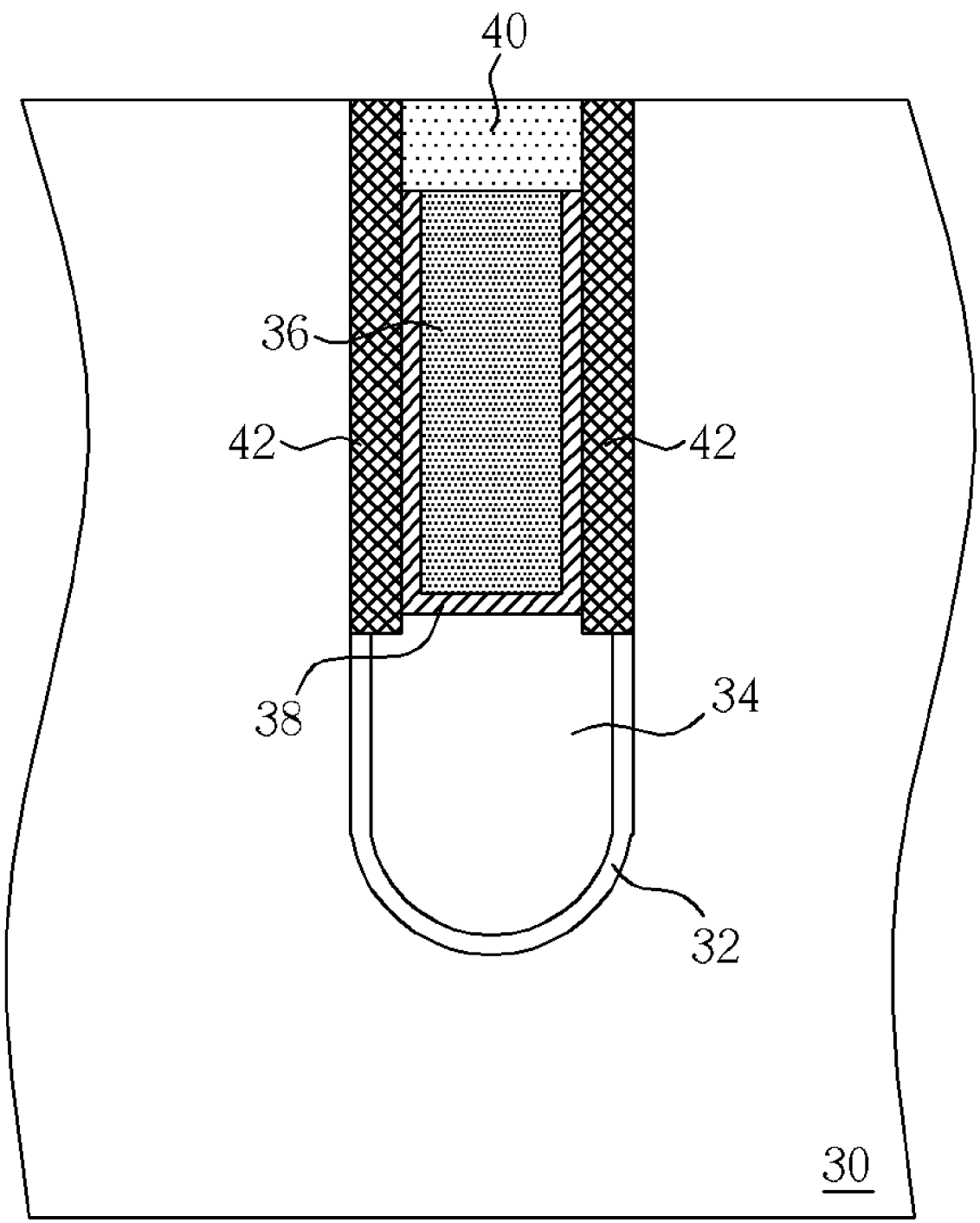
FIG. 2 illustrates a schematically cross-sectional view of an embodiment of the semiconductor structure according to the present invention.

FIG. 2 illustrates a schematically cross-sectional view of an embodiment of the present invention, which may be also applied to an extended-U-shape device (EUD) type transistor. As shown in FIG. 2, the semiconductor structure comprises a semiconductor substrate 30 and a film stack structure of a U-shape gate dielectric layer 32, a gate region 34, a conducting layer 36, an adhesive layer 38, a cover dielectric layer 40, and a pair of inner spacers 42.

The semiconductor substrate 30 has a trench, such as a U-shape trench, defined therein. The U-shape gate dielectric layer 32 is disposed in the bottom surface of the U-shape trench of the semiconductor substrate 30 and may be for example a silicon oxide compound layer formed from the oxidation of silicon at the surface of the semiconductor substrate. The portion of the semiconductor substrate 30 surrounding the U-shape gate dielectric layer 32 will serve as a gate channel.

The gate region 34 is disposed in the U-shape trench formed in the U-shape gate dielectric layer 32. The gate region 34 may be deposited into the trench by deposition and then etched back to the height as desired. The gate region 34 may comprise, for example, polysilicon.

The conducting layer 36 is disposed above the gate region 34 and in the upper portion of the U-shape trench of the semiconductor substrate 30. The conducting layer 36 serves as a word line and may comprise, for example, one selected from the group consisting of tungsten, nickel, copper, cobalt, a combination thereof, and a silicide thereof or a material of low resistance.

An adhesive layer 38 may be optionally further disposed to surround the bottom and the two sidewalls of the conducting layer 36, such that the conducting layer 36 and the gate region 34 are separated by the adhesive layer 38. In addition to having the function of bonding the conducting layer with the polysilicon layer, the adhesive layer also plays a role as a barrier layer to inhibit the diffusion of the ingredients of the conducting layer into the gate region to affect the electric properties. The adhesive layer may comprise one selected from the group consisting of titanium, tantalum, an alloy thereof, and a nitride thereof, for example, Ti, Ta, TiN, TaN, TiTa alloy, and the like, or a material of low resistance. As shown in FIG. 2, the semiconductor structure comprises an adhesive layer, but it is not necessary.

A cover dielectric layer 40 covers the top of the conducting layer 36 and the top of the adhesive layer 38. A pair of inner spacers 42 are disposed above the top of the two sidewalls of the U-shape gate dielectric layer 32, i.e. each with a bottom edge connecting to an end of the dielectric layer, and on the sidewalls of the adhesive layer 38 (at the two sides of the conducting layer 36 respectively). The inner spacers 42 with the cover dielectric layer 40 together form a shape of box with no bottom and separate the adhesive layer 38 and the conducting layer 36 from the semiconductor substrate 30. Such kind of separation has an advantage of deep junction. Since the area is large, the resistance is small. The cover dielectric layer and the inner spacers may include dielectric material, such as silicon nitride, silicon oxide, and the like.

In one embodiment, the inner spacers 42 are formed on the sidewalls of the upper portion of the U-shape trench of the semiconductor substrate, and, thereafter, an adhesive layer 38 is formed on the surface of the exposed sidewalls of the inner spacers 42 and the top of the gate region 34. Thereafter, a conducting layer 36 is formed in the trench having the adhesive layer 38 therein. Finally, a cover dielectric layer 40 covers the conducting layer and the adhesive layer. As shown in FIG. 2, the cover dielectric layer 40 is disposed between two inner spacers 42, but not limited thereto. The cover dielectric layer 40 may be allowed to cover the top of these two inner spacers 42, as long as the inner spacers 42 with the cover dielectric layer 40 together can form a shape of box with no bottom to separate the conducting layer and the adhesive layer from the semiconductor substrate.

Figure 3:
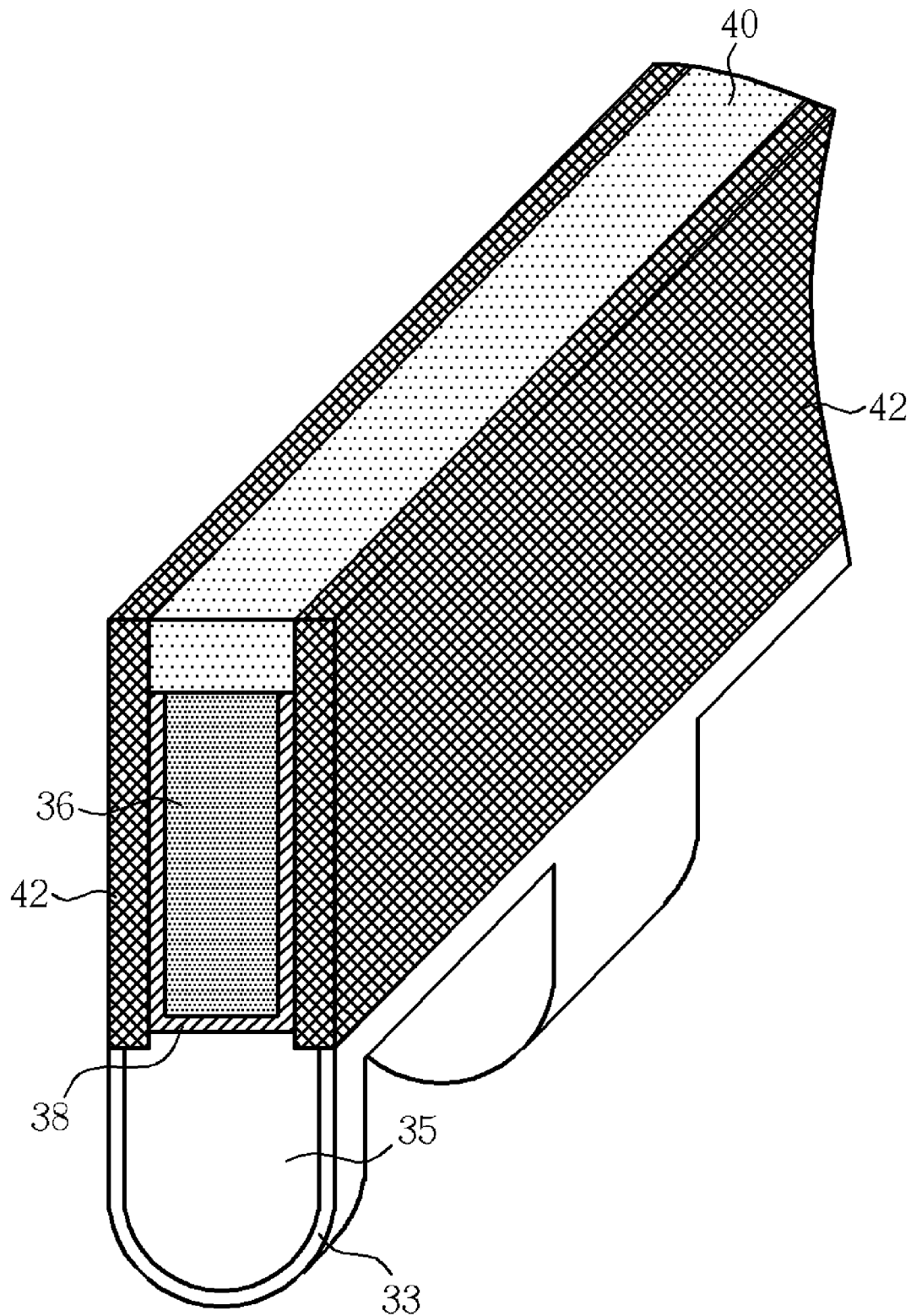
FIG. 3 illustrates a schematically partially cross-sectional view and partially perspective view of another embodiment of the semiconductor structure according to the present invention.

Furthermore, the semiconductor structure according to the present invention may have other modified aspects. For example, referring to FIG. 3 showing a schematically partially cross-sectional view and partially perspective view of a semiconductor structure according to the present invention, the bottom portions of the U-shape trench of the semiconductor substrate, the U-shape gate dielectric layer 33, and the gate region 35 together may have an indent, that is, the semiconductor substrate correspondingly forms a fin structure. Alternatively, the bottom portions of the U-shape trench of the semiconductor substrate, the U-shape gate dielectric layer, and the gate region may further with the bottom portions of the adhesive layer and the conducting layer together to have an indent. Such structure may be utilized in a fin transistor. The indent structure may be formed through forming a U-shape trench in the semiconductor substrate, followed by partially etching the trench to obtain a bottom having an indent, and subsequently forming films on the bottom having the indent. Correspondingly, the films obtained have an indent.

Those skilled in the art will readily observe that numerous modifications and alterations of the device and method may be made while retaining the teachings of the invention.

What is claimed is:

1. A semiconductor structure comprising:
a substrate having a trench defined in the substrate;
a dielectric layer formed on a bottom surface of the trench;
a gate region formed on and enclosed by the dielectric layer in the trench;
a conducting layer formed within the trench and above the gate region, the conducting layer being electrically connected to the gate region;
a pair of inner spacers formed on two opposed inner surfaces of the trench to surround the conducting layer, wherein each of the pair of the inner spacers has a bottom edge connecting to a respective one of two ends of the dielectric layer; and
a cover dielectric layer formed in the top portion of the trench to cover the conducting layer.

2. The semiconductor structure of claim 1, wherein the conducting layer is served as a word line.

3. The semiconductor structure of claim 2, wherein the conducting layer comprises a material selected from the group consisting of tungsten, nickel, copper, cobalt, a combination thereof, and a silicide thereof.

4. The semiconductor structure of claim 3, wherein the conducting layer comprises a material of low resistance.

5. The semiconductor structure of claim 1, further comprising an adhesive layer formed between the conducting layer and the gate region, such that the conducting layer and the gate region are separated by the adhesive layer.

6. The semiconductor structure of claim 5, wherein the adhesive layer comprises a material selected from the group consisting of titanium, tantalum, an alloy thereof, and a nitride thereof.

7. The semiconductor structure of claim 6, wherein the adhesive layer comprises a material of low resistance.

* * * * *